United States Patent
Ciou et al.

(10) Patent No.: US 9,887,359 B2
(45) Date of Patent: Feb. 6, 2018

(54) ORGANIC ELECTRO-LUMINESCENCE DEVICE AND FABRICATING METHOD THEREOF

(71) Applicant: Industrial Technology Research Institute, Hsinchu (TW)

(72) Inventors: Jyun-Kai Ciou, Changhua County (TW); Chao-Feng Sung, Hsinchu (TW); Cheng-Yi Chen, Taichung (TW); Yung-Min Hsieh, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/080,560

(22) Filed: Mar. 24, 2016

(65) Prior Publication Data

US 2016/0293901 A1    Oct. 6, 2016

Related U.S. Application Data

(63) Continuation-in-part of application No. 14/953,428, filed on Nov. 30, 2015.

(Continued)

(51) Int. Cl.
| | | |
|---|---|---|
| H01L 21/00 | (2006.01) | |
| *H01L 51/00* | (2006.01) | |
| H01L 51/50 | (2006.01) | |

(52) U.S. Cl.
CPC ...... *H01L 51/0023* (2013.01); *H01L 51/0011* (2013.01); *H01L 51/5012* (2013.01)

(58) Field of Classification Search
CPC ............. H01L 51/0023; H01L 51/0011; H01L 51/0012

(Continued)

(56) References Cited

U.S. PATENT DOCUMENTS 6,013,538 A * 1/2000 Burrows ................ H01L 27/32
                                                                257/40
8,596,509 B2  12/2013 Kim et al.
(Continued)

FOREIGN PATENT DOCUMENTS

CN      101577283      11/2009
CN      102222778      10/2011
(Continued)

OTHER PUBLICATIONS

Mark Dai Joong Auch, et al., "Ultrathin glass for flexible OLED application," Thin Solid Films, vol. 417, Sep. 30, 2002, pp. 47-50.
(Continued)

*Primary Examiner* — Trung Q Dang
*Assistant Examiner* — Patricia Reddington
(74) *Attorney, Agent, or Firm* — JCIPRNET

(57) ABSTRACT

A method for fabricating an organic electro-luminescence device, including: on a substrate, forming a first conductive layer including a first electrode and a first contact pattern electrically insulated therefrom; on the first conductive layer, forming a first mask including a release film, a base film disposed between the release film and the first conductive layer and an opening for partially exposing the first electrode and the first contact pattern; by shielding of a second mask, forming a patterned organic functional layer partially covering the first mask and the first electrode exposed by the first mask; removing the second mask; forming a second conductive layer over the structure aforesaid; and patterning the second conductive layer by removing the release film and the second conductive layer formed thereon to form a second electrode electrically connected to the first contact pattern and a second contact pattern electrically connected to the first electrode.

20 Claims, 9 Drawing Sheets

Related U.S. Application Data

(60) Provisional application No. 62/140,474, filed on Mar. 31, 2015, provisional application No. 62/264,851, filed on Dec. 8, 2015.

(58) Field of Classification Search
USPC .......................................................... 438/46
See application file for complete search history.

(56) References Cited

U.S. PATENT DOCUMENTS

| | | |
|---|---|---|
| 8,674,377 B2 | 3/2014 | Farquhar |
| 8,912,018 B2 | 12/2014 | Burrows et al. |
| 2007/0138952 A1 | 6/2007 | Liu et al. |
| 2009/0253336 A1 | 10/2009 | Ito et al. |
| 2009/0274830 A1 | 11/2009 | White et al. |
| 2014/0141683 A1 | 5/2014 | Zhou |
| 2017/0012241 A1* | 1/2017 | Fujita .................. H01L 51/5203 |

FOREIGN PATENT DOCUMENTS

| | | |
|---|---|---|
| CN | 103682155 | 3/2014 |
| CN | 103872084 | 6/2014 |
| JP | 200959834 A | 3/2009 |
| TW | 201526327 | 7/2015 |
| TW | I500077 | 9/2015 |
| WO | 2010071035 | 6/2010 |

OTHER PUBLICATIONS

Su Shen, et al., "Microlens array film fabricated by UV roll-to-roll nanoimprinting for enhancing out-coupling efficiency of organic light-emitting devices," 2012 International Conference on Manipulation, Manufacturing and Measurement on the Nanoscale (3M-NANO), Aug. 29-Sep. 1, 2012, pp. 165-168.

Akira Sugimoto, et al., "Flexible OLED Displays Using Plastic Substrates," IEEE Journal of Selected Topics in Quantum Electronics, vol. 10, No. 1, Jan./Feb. 2004, pp. 107-114.

Jukka Hast, et al., "Freeform and flexible electronics manufacturing using R2R printing and hybrid integration techniques," 2014 44th European Solid State Device Research Conference (ESSDERC), Sep. 22-26, 2014, pp. 198-201.

Jukka Hast, et al, "Roll-to-Roll Manufacturing of Printed OLEDs," SID Symposium Digest of Technical Papers, vol. 44, Issue 1, Jun. 2013, pp. 192-195.

"Office Action of Chinan Counterpart Application", dated Jun. 1, 2017, p. 1-p. 5, in which the listed references were cited.

* cited by examiner

ORGANIC ELECTRO-LUMINESCENCE DEVICE AND FABRICATING METHOD THEREOF

CROSS-REFERENCE TO RELATED APPLICATION

This application is a continuation-in-part application of and claims the priority benefit of a prior application Ser. No. 14/953,428, filed on Nov. 30, 2015, now pending. The prior application Ser. No. 14/953,428 claims the priority benefit of U.S. provisional application Ser. No. 62/140,474, filed on Mar. 31, 2015. This application also claims the priority benefits of U.S. provisional application Ser. No. 62/264,851, filed on Dec. 8, 2015. The entirety of each of the above-mentioned patent applications is hereby incorporated by reference herein and made a part of this specification.

BACKGROUND

1. Field of the Disclosure

The present disclosure generally relates to an organic electro-luminescence device and a method for fabricating the organic electro-luminescence device.

2. Description of Related Art

Organic electro-luminescent devices having high quantum efficiency and low power consumption are widely utilized in display and illumination fields. Since organic electro-luminescent devices are advantaged in light-weight and nice color rendering, organic electro-luminescent devices are considered as a mainstream of next generation displays and illumination devices. Currently, fabrication cost of organic electro-luminescent devices cannot be reduced easily, and different roll-to-roll processes and apparatuses designed for mass production are proposed accordingly.

However, the aforesaid roll-to-roll processes for fabricating organic electro-luminescence devices suffers serious alignment issue (i.e. mis-alignment between stacked layers of the fabricated organic electro-luminescence devices occurs) which causes low yield rate. The aforesaid roll-to-roll processes for fabricating organic electro-luminescence devices suffers throughput issue as well. Accordingly, solutions for resolving the alignment and throughput issues during the roll-to-roll processes are required.

SUMMARY

Accordingly, the present disclosure is directed to an organic electro-luminescence device and a method for fabricating the same.

A method for fabricating an organic electro-luminescence device, including: forming a first conductive layer on a substrate, the first conductive layer including a first electrode and a first contact pattern electrically insulated from the first electrode; forming a first mask on the first conductive layer, the first mask including a release film, a base film disposed between the release film and the first conductive layer and at least one opening for exposing at least one portion of the first electrode and a portion of the first contact pattern; forming a patterned organic functional layer by shielding of a second mask, the patterned organic functional layer covering a portion the first mask and the at least one portion of the first electrode exposed by the first mask, and the second mask being disposed over the first mask to shield at least one portion of the first electrode exposed by the first mask and the portion of the first contact pattern exposed by the first mask; removing the second mask after forming the patterned organic functional layer; forming a second conductive layer over the patterned organic functional layer, the first mask, the at least one portion of the first electrode exposed by the first mask and the portion of the first contact pattern exposed by the first mask; and patterning the second conductive layer by removing the release film and a portion of the second conductive layer on the release film to form a second electrode electrically connected to the first contact pattern and a second contact pattern electrically connected to the first electrode.

An organic electro-luminescence device, including: a substrate; a first conductive layer formed on the substrate comprising a first electrode and a first contact pattern, wherein the first contact pattern is electrically insulated from the first electrode; a base film disposed on the first conductive layer comprising at least one opening for exposing at least one portion of the first electrode and a portion of the first contact pattern; a patterned organic functional layer disposed on the portion of the first electrode exposed by the base film; and a second conductive layer comprising a second electrode and a second contact pattern, the second electrode being disposed on the organic functional layer and the portion of the first contact pattern exposed by the base film, the second contact pattern being disposed on the at least one portion of the first electrode exposed by the base film, wherein the second electrode is electrically connected to the first contact pattern and the second contact pattern is electrically connected to the first electrode.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
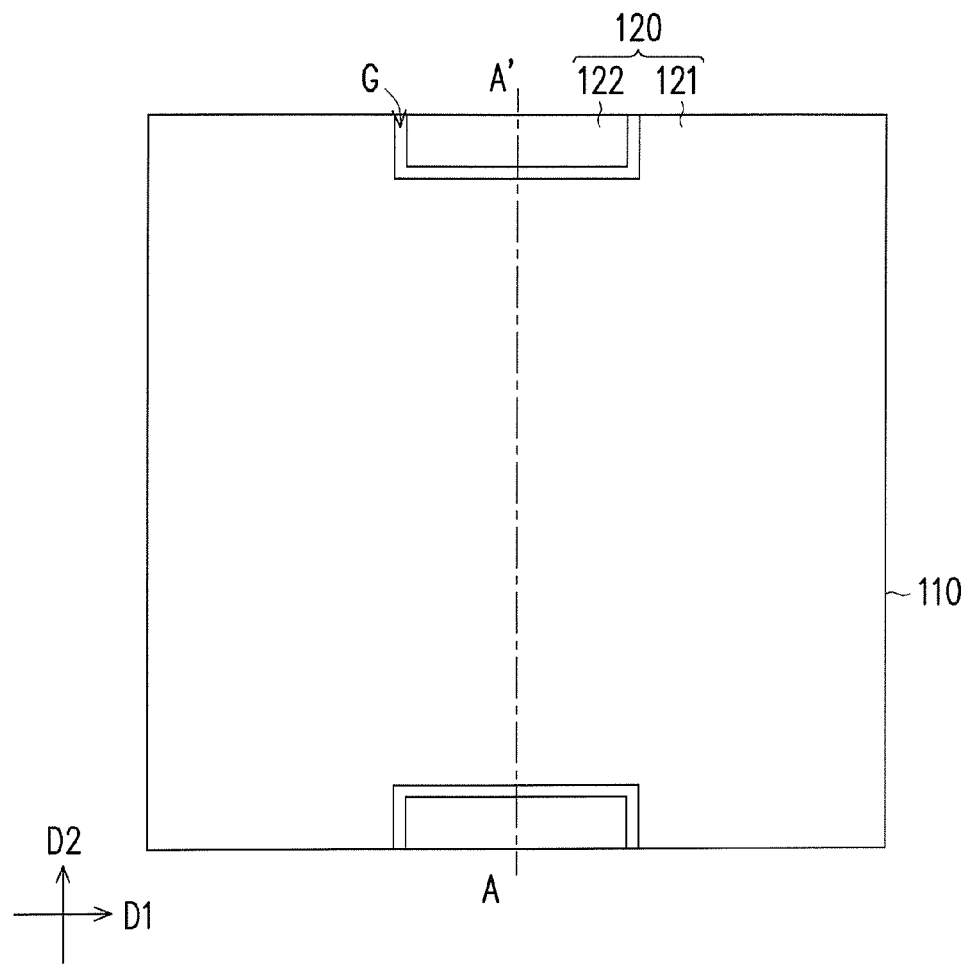
FIG. 1A through FIG. 1H schematically illustrate a method for fabricating an organic electro-luminescence device in accordance with an embodiment.
Figure 2A:
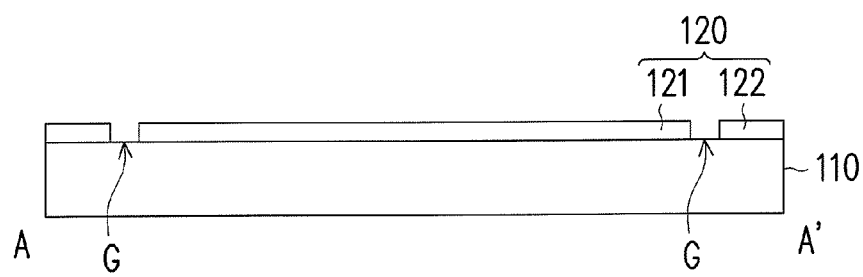
FIG. 2A through FIG. 2H are cross-sectional views along the cross-section A-A' in FIG. 1A through FIG. 1H.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1A through FIG. 1H schematically illustrate a method for fabricating an organic electro-luminescence device 100 in accordance with an embodiment. FIG. 2A through FIG. 2H are cross-sectional views along the cross-section A-A' in FIG. 1A through FIG. 1H.

Referring to FIG. 1A through FIG. 1H and FIG. 2A through FIG. 2H, a method for fabricating an organic electro-luminescence device 100 is provided for roll-to-roll process. In the present embodiment, referring to FIG. 1A and FIG. 2A, a substrate 110 is provided with a first conductive layer 120 formed thereon and conveyed by rollers (not shown) along a transmission direction D1. The substrate 110 is an ultra-thin (e.g. less than 100 micro-meter) and flexible glass substrate. However, the material of the substrate 110 is not limited thereto. Rigid substrates may be used in the present embodiment also. The first conductive layer 120 includes a first electrode 121 and at least one first contact pattern 122 electrically insulated from the first electrode 121. As shown in FIG. 1A, in this embodiment, two first contact patterns 122 are formed at two opposite peripheral sides of the first conductive layer 120. It is noted that the shape and the number of the first contact patterns 122 are not limited in the disclosure.

In this embodiment, the first electrode 121 and the first contact patterns 122 may, for instance, be fabricated by the following steps. First, a transparent conductive oxide (TCO) layer is formed over the substrate 110 through sputtering, for example. The material of the TCO layer may be indium tin oxide (ITO) or indium zinc oxide (IZO). However, the material of the TCO layer is not limited thereto. Then, the TCO layer is patterned through laser irradiation provided by a laser light source (not shown), for example, to form the first electrode 121 and the first contact patterns 122. After the first conductive layer 120 is patterned, the first conductive layer 120 may include two notches located at two opposite peripheral sides thereof and the first contact patterns 122 are located in the notches. As shown in FIG. 1A, after the first conductive layer 120 is patterned, a gap G exists between the first electrode 121 and each first contact pattern 122 such that the first contact patterns 122 are capable of being electrically insulated from the first electrode 121.

Figure 1B:
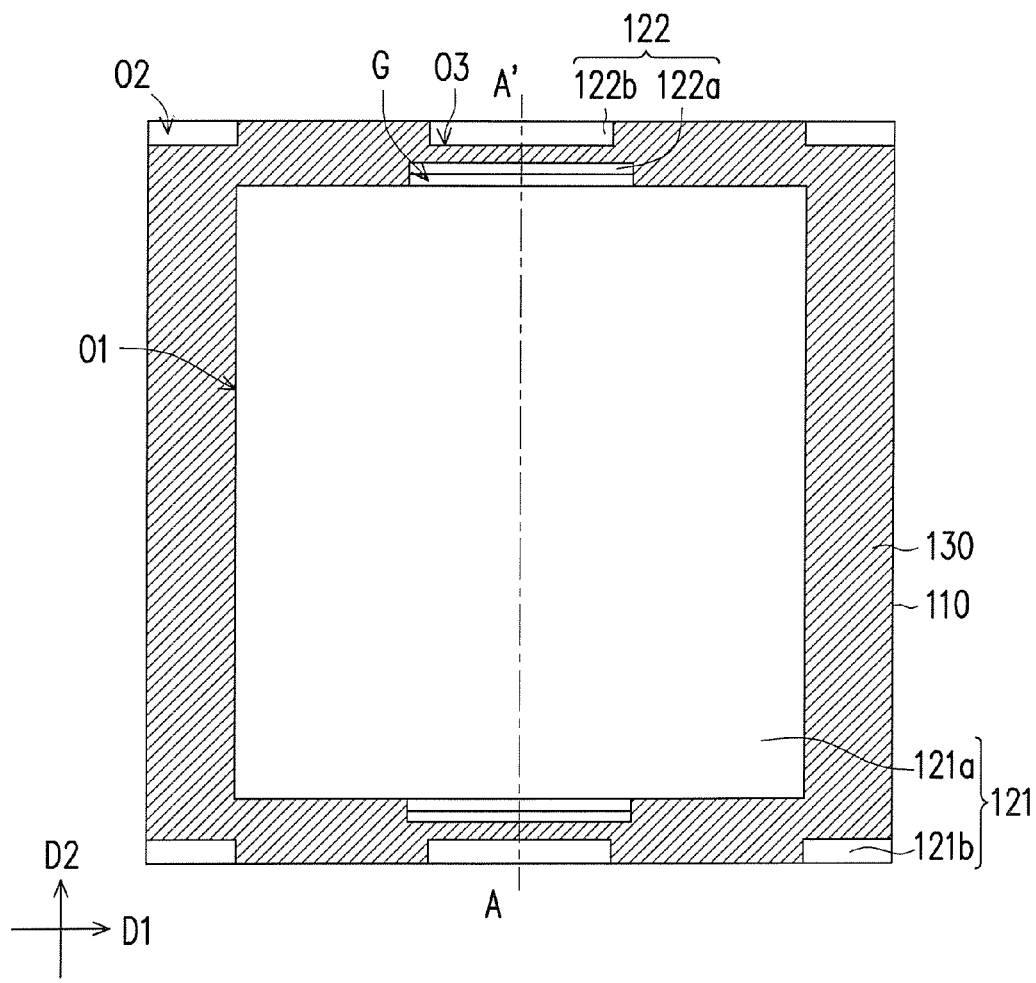
Figure 2B:
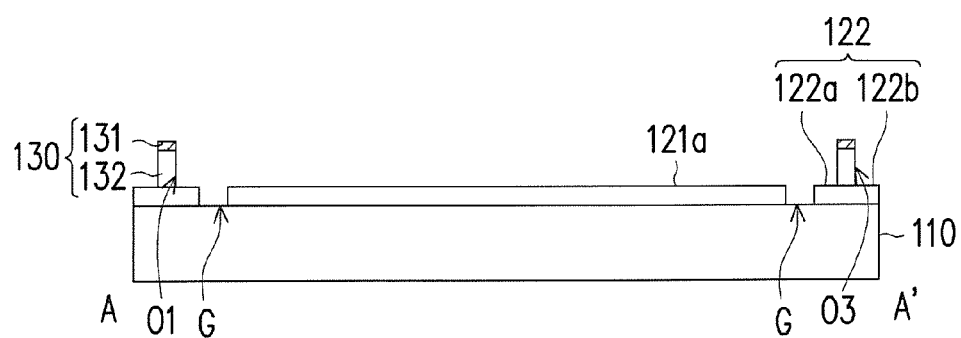

Referring to FIG. 1B and FIG. 2B, after the first electrode 121 and the first contact patterns 122 are formed over the substrate 110, a first mask 130 is formed on the first conductive layer 120. The first mask 130 may include a release film 131, a base film 132 disposed between the release film 131 and the first conductive layer 120 and at least one opening (e.g., opening O1) for exposing at least one portion of the first electrode 121 and a portion of the first contact patterns 122. The base film 132 may be made of acryl-based resin, epoxy-based resin, polymide, polyethylene (PE), polypropylene (PP), polyethylene terephthalate (PET), polyvinyl chloride (PVC) or polystyrene (PS), but not limited thereto.

In this embodiment, the first mask 130 may be a frame mask including a main opening O1 located in a central area of the first mask 130, at least one first peripheral opening O2 located at a corner of the first mask 130 and at least one second peripheral opening O3 located at a peripheral side of the first mask 130 that is parallel to the transmission direction D1. The main opening O1 is utilized to roughly define light-emitting area of the organic electro-luminescence device 100. As shown in FIG. 1B, there are four first peripheral openings O2 respectively located at each corner of the first mask 130 and two second peripheral openings O3 located at two opposite peripheral sides of the first mask 130 parallel to the transmission direction D1. The number and shape of the openings O1, O2 and O3 are not limited in the disclosure.

Referring to FIG. 1B, the first electrode 121 may include a portion 121a located in a central area of the first electrode 121 and at least one portion 121b located at a corner of the first electrode 121. The portion 121a of the first electrode 121 located in central area of the first electrode 121 and a portion 122a of each first contact pattern are exposed by the main opening O1 of the first mask 130. Meanwhile, the portions 121b of the first electrode 121 located at each corner of the first electrode 121 are exposed by the first peripheral openings O2 of the first mask 130 and portions 122b of the first contact patterns 122 are exposed by the second peripheral openings O3 of the first mask 130. Furthermore, the gaps G between the first electrode 121 and each first contact pattern 122 are partially exposed by the main opening O1 of the first mask 130, as shown in FIG. 1B.

Figure 1C:
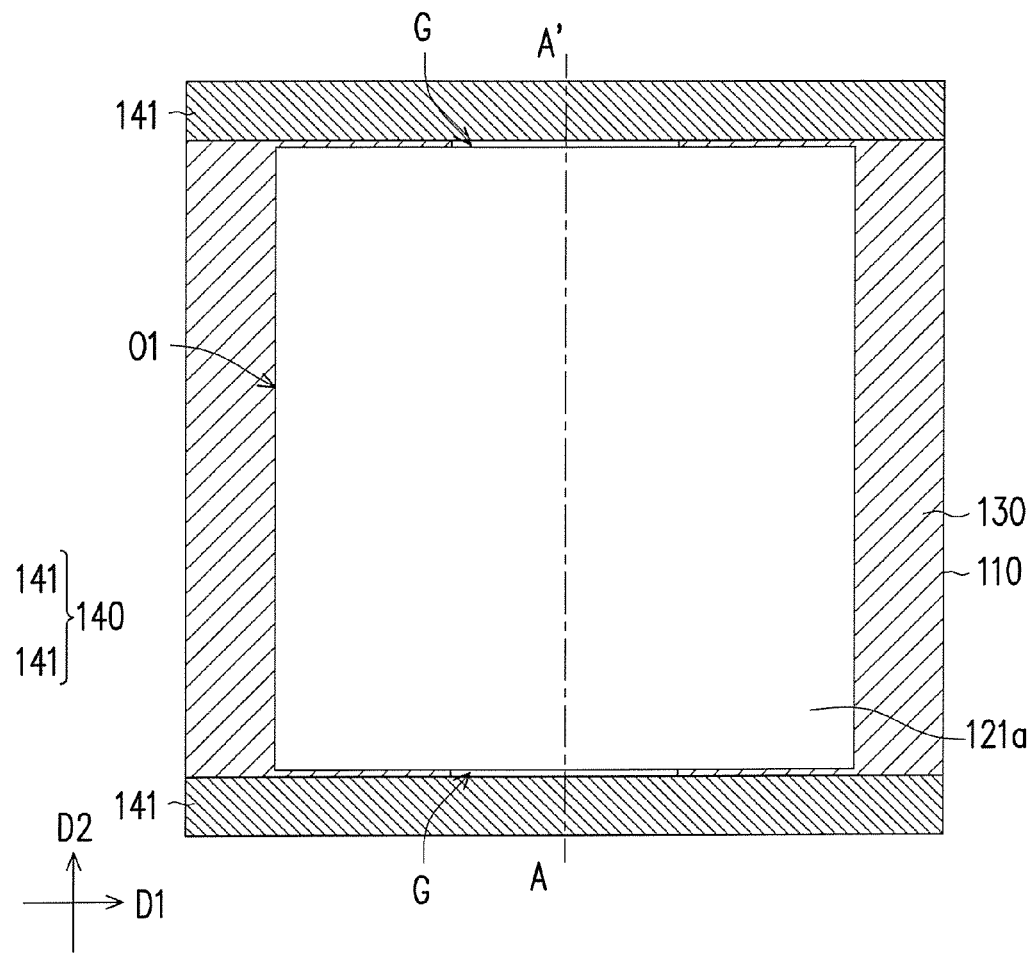
Figure 2C:
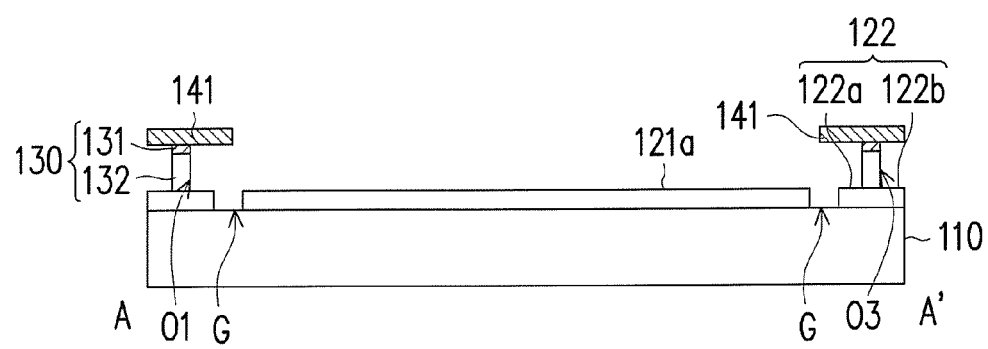

Referring to FIG. 1C and FIG. 2C, a second mask 140 is provided over the first mask 130 so as to shield the portions 121b of the first electrode 121 exposed by the first peripheral openings O2 and the portions (122a, 122b) of first contact pattern 122 exposed by the main opening O1 and the second peripheral openings O3 of the first mask 130. In addition, the gaps G are partially covered and shielded by the second mask 140, and portions of the first mask 130 are uncovered and exposed by the second mask 140. As shown in FIG. 1B and FIG. 1C, the second mask 140 may include at least one pair of shielding strips 141, and a lengthwise direction of the shielding strips 141 is parallel to the transmission direction D1. In this embodiment, the second mask 140 is provided over and in contact with the first mask 130, and the second mask 140 is not in contact with the first conductive layer 120, for example.

Figure 1D:
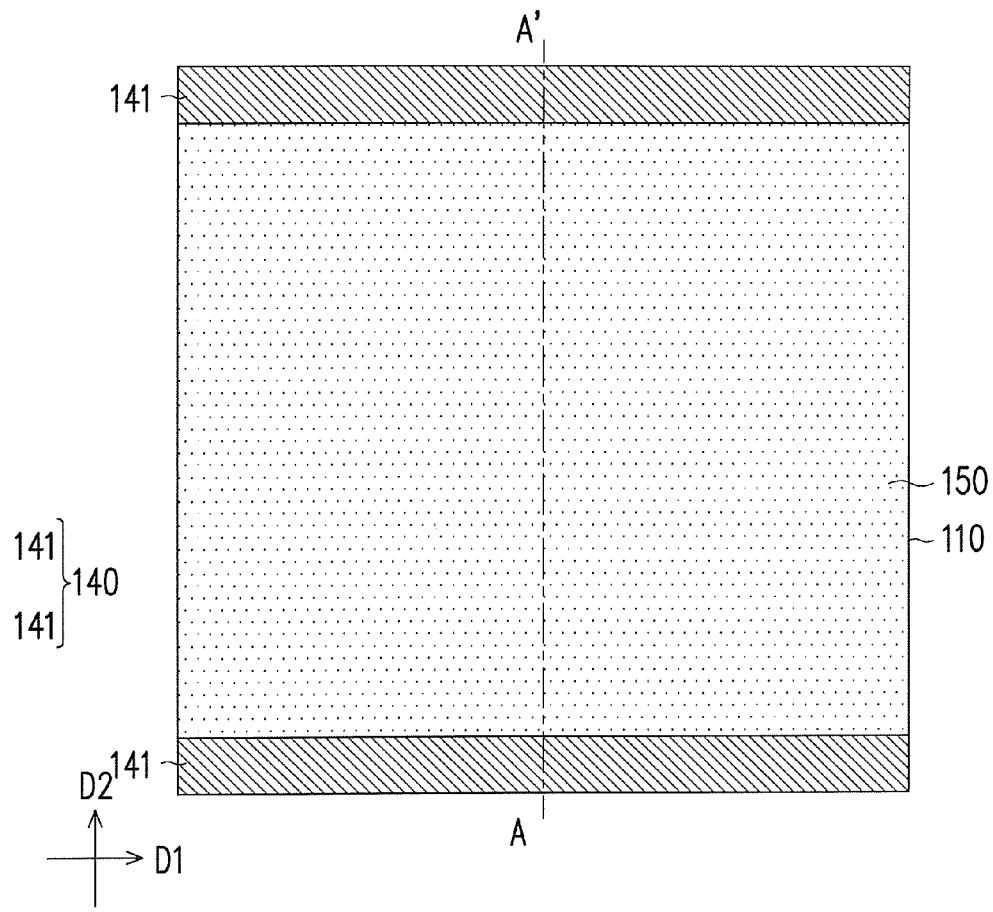
Figure 2D:
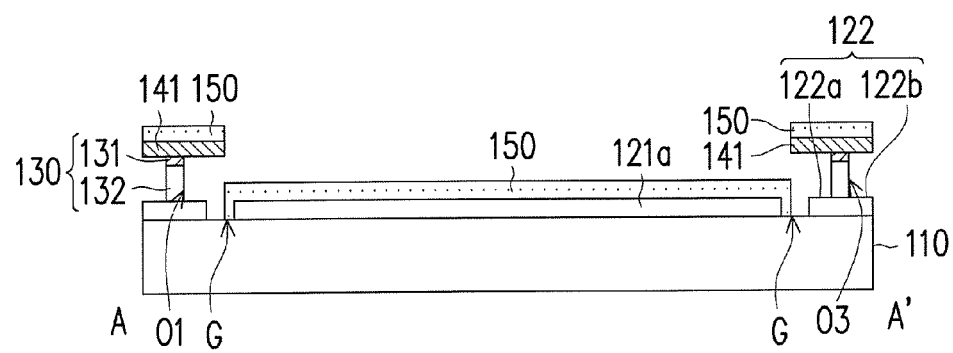

Referring to FIG. 1D and FIG. 2D, after the second mask 140 is provided, an evaporation process is, for example, performed to form a patterned organic functional layer 150 by shielding of the second mask 140. The patterned organic functional layer 150 covers the portions of the first mask 130 exposed by the second mask 140 and the portion 121a of the first electrode 121 that is exposed by the first opening O1 of the first mask 130. In addition, portions of the gaps G exposed by the second mask 140 are covered and filled by the patterned organic functional layer 150. It is noted that, the patterned organic functional layer 150 not only covers the portions of the first mask 130 exposed by the second mask 140 and the portion 121a of the first electrode 121 that is exposed by the first opening O1 of the first mask 130, the patterned organic functional layer 150 is also formed over the top surface of the second mask 140.

As shown in FIG. 2D, since the gap G is partially shielded by the second mask 140, the evaporated patterned organic functional layer 150 may cover sidewalls of the portion 121a of the first electrode 121 that are exposed by the main opening O1 of the first mask 130 and contact the substrate 110. In other words, the patterned organic functional layer 150 may extend into the gaps G exposed by the second mask 140 so as to encapsulate sidewalls and a top surface of the first electrode 121 that are exposed by the first opening O1 of the first mask 130. In addition, since the gap G is partially shielded by the second mask 140, the patterned organic functional layer 150 is not in contact with the first contact patterns 122. In some alternative embodiments, the patterned organic functional layer 150 may be in contact with the first contact patterns 122 as the gap G is exposed by the second mask 140.

Figure 1E:
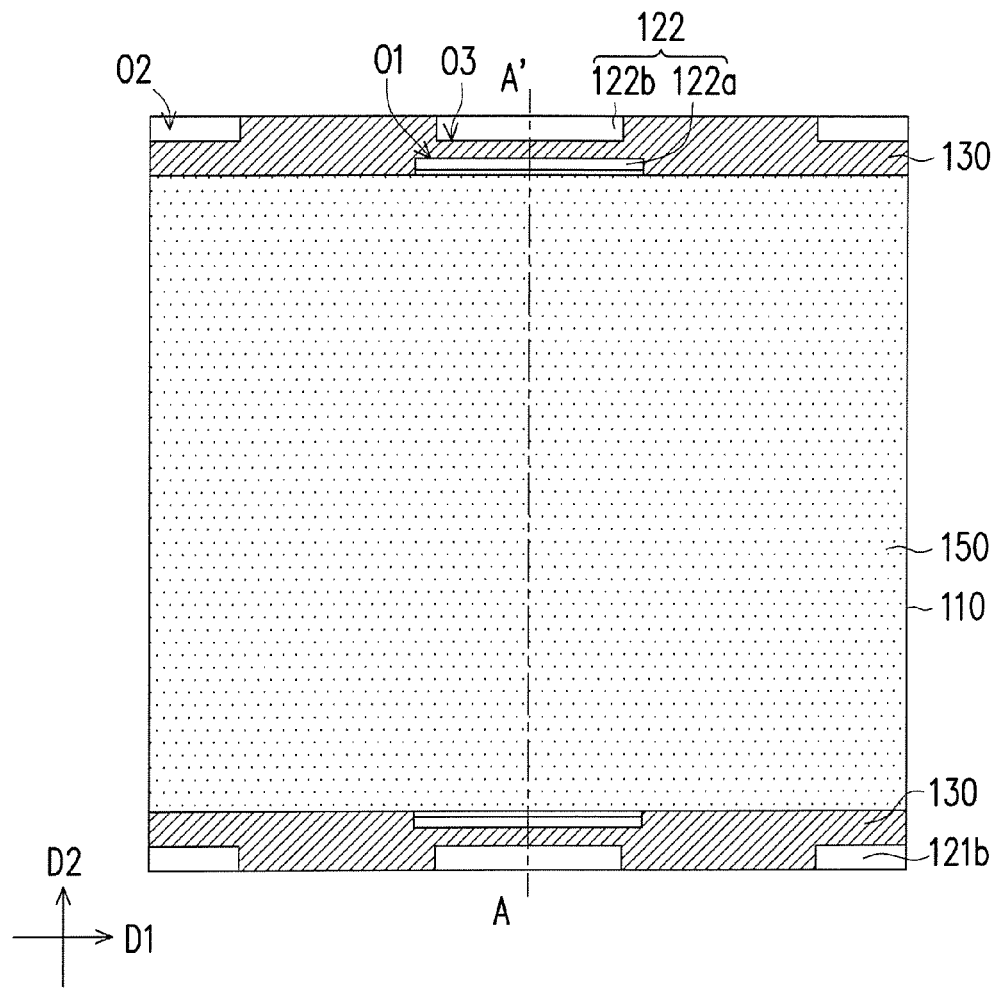
Figure 2E:
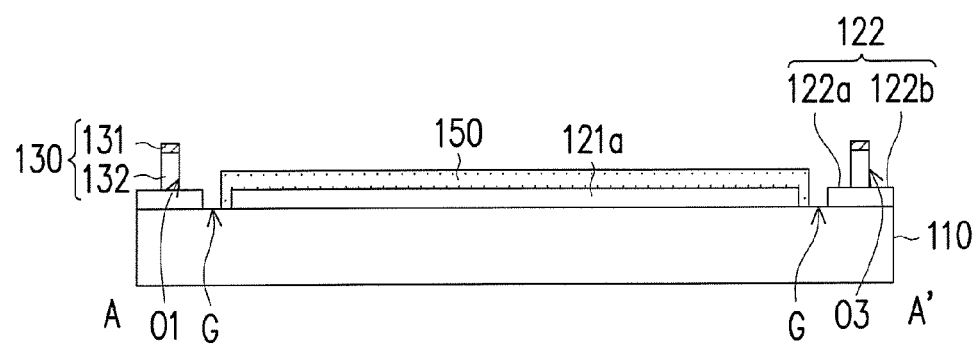

Referring to FIG. 1E and FIG. 2E, after forming the patterned organic functional layer 150, the substrate 110 including the first conductive layer 120, the first mask 130 and the patterned organic functional layer 150 formed thereon is conveyed along the transmission direction D1 to ensure that the second mask 140 is removed.

Figure 1F:
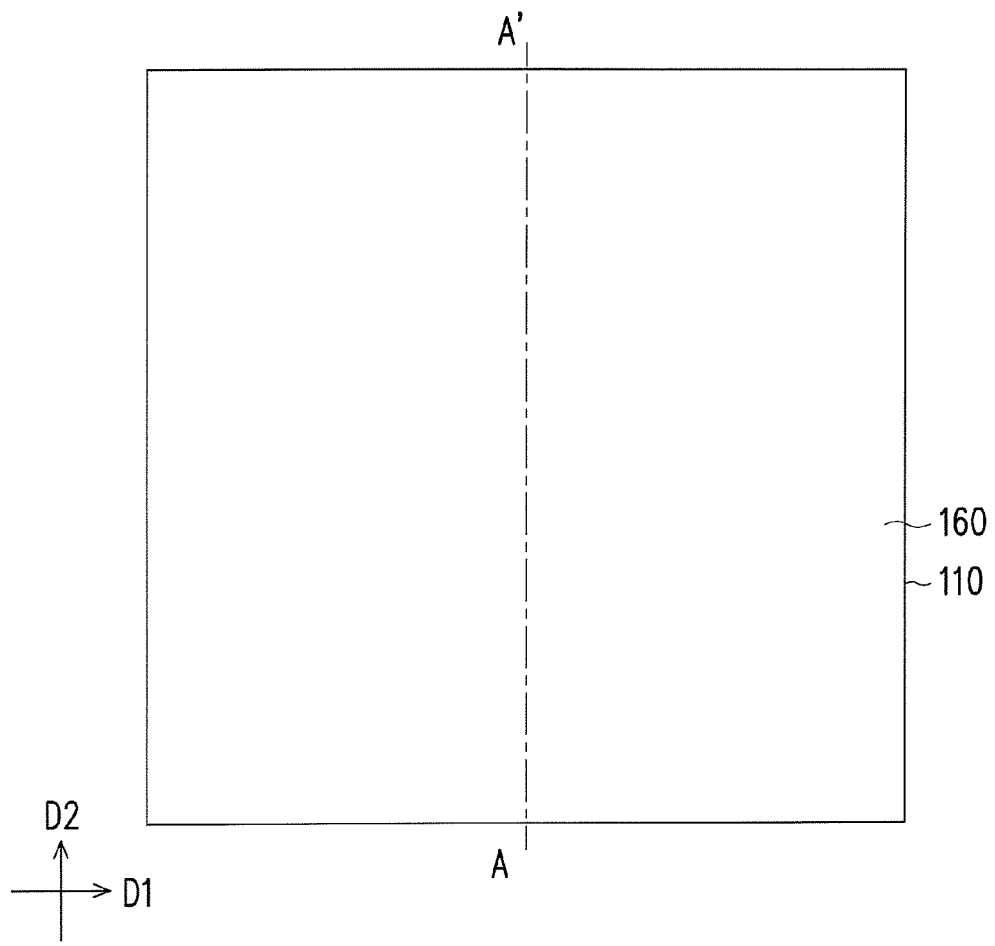
Figure 2F:
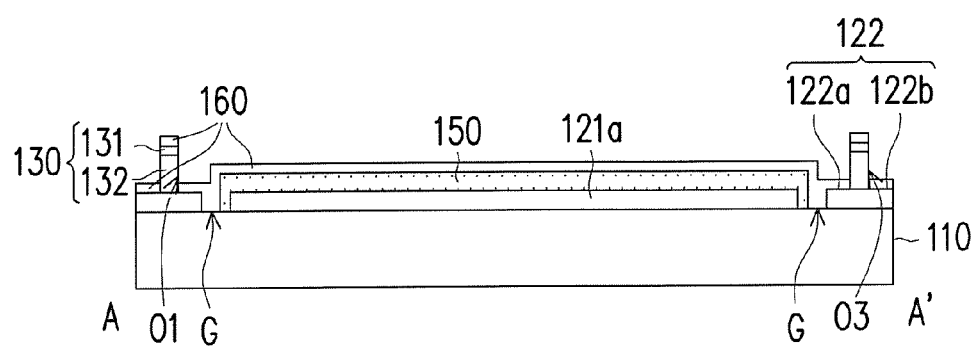

Then, referring to FIG. 1F and FIG. 2F a second conductive layer 160 is formed over the patterned organic functional layer 150, the first mask 130 partially exposed by the patterned organic functional layer 150, the portion 121b of the first electrode 121 and the portions 122a, 122b of first contact pattern 122 exposed by first mask 130. In this embodiment, the second conductive layer 160 is formed by evaporation process.

Figure 1G:
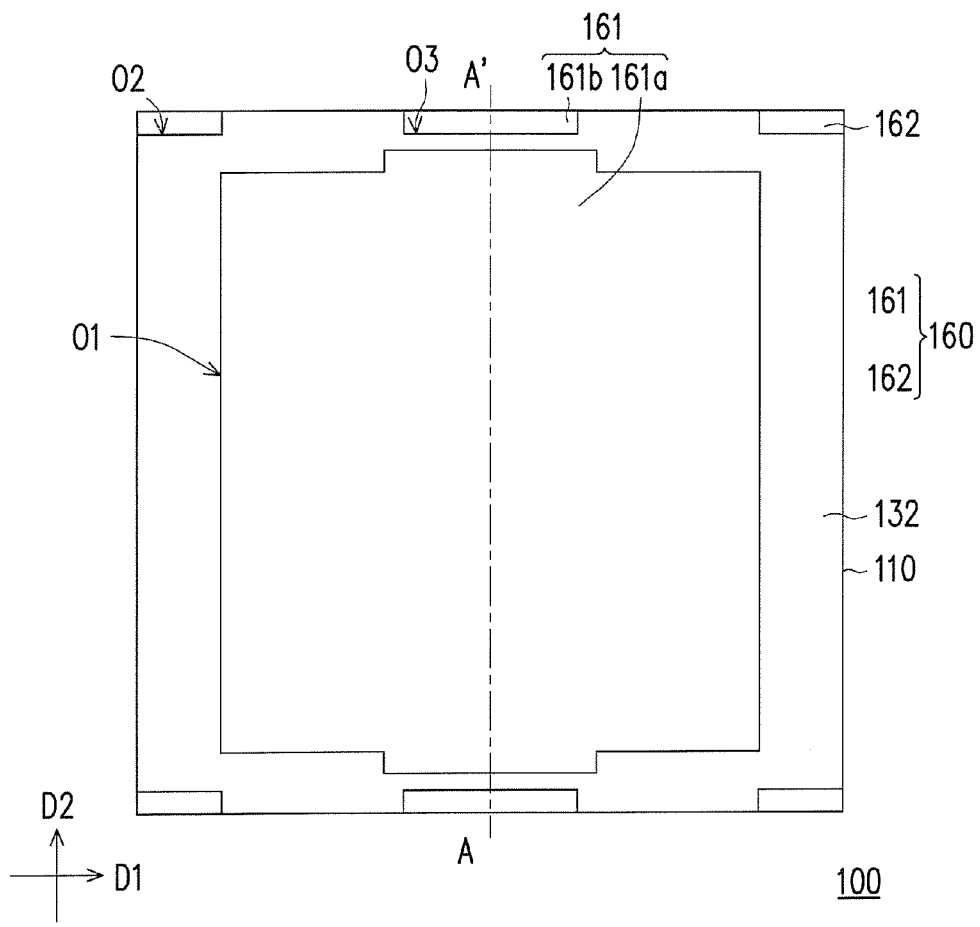
Figure 2G:
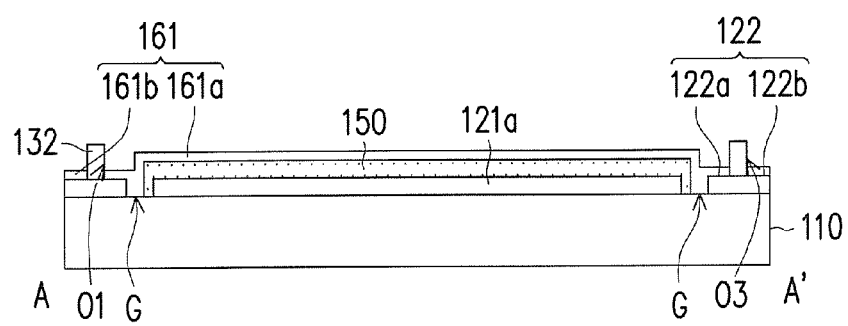

Referring to FIG. 1G and FIG. 2G, after the second conductive layer 160 is formed, the second conductive layer 160 is patterned by removing the release film 131 of the first mask 120, a portion of the patterned organic functional layer 150 formed on the release film 131 and a portion of the second conductive layer 160 formed on the release film 131 so as to form a second electrode 161 and at least one second contact patterns 162. In other words, the portion of the patterned organic functional layer 150 formed and the portion of the second conductive layer 160 formed on the release film 131 are lift-off from the base film 132. Referring to FIG. 2G, the second electrode 161 may include a portion 161a and at least one portion 161b. The portion 161a of the second electrode 161 is formed on the patterned organic functional layer 150 and the portions 122a of the first contact patterns 122 exposed by the main opening O1 and is spaced apart from the first electrode 121 by the patterned organic functional layer 150. The portions 161b of the second electrode 161 are formed on the portions 122b of the first contact patterns 122 exposed by the second peripheral openings O3. As a result, the patterned organic functional layer 150 may prevent short circuit between the first electrode 121 and the second electrode 161. The second contact patterns 162 are formed on the portions 121b of the first electrode 121 exposed by the first peripheral opening O2. Accordingly, the second electrode 161 is electrically connected to the first contact patterns 122 and the second contact patterns 162 are electrically connected to the first electrode 121. After the second electrode 161 and the second contact patterns 162 are formed, fabrication of the organic electro-luminescence device 100 of this embodiment is about to accomplished.

Figure 1H:
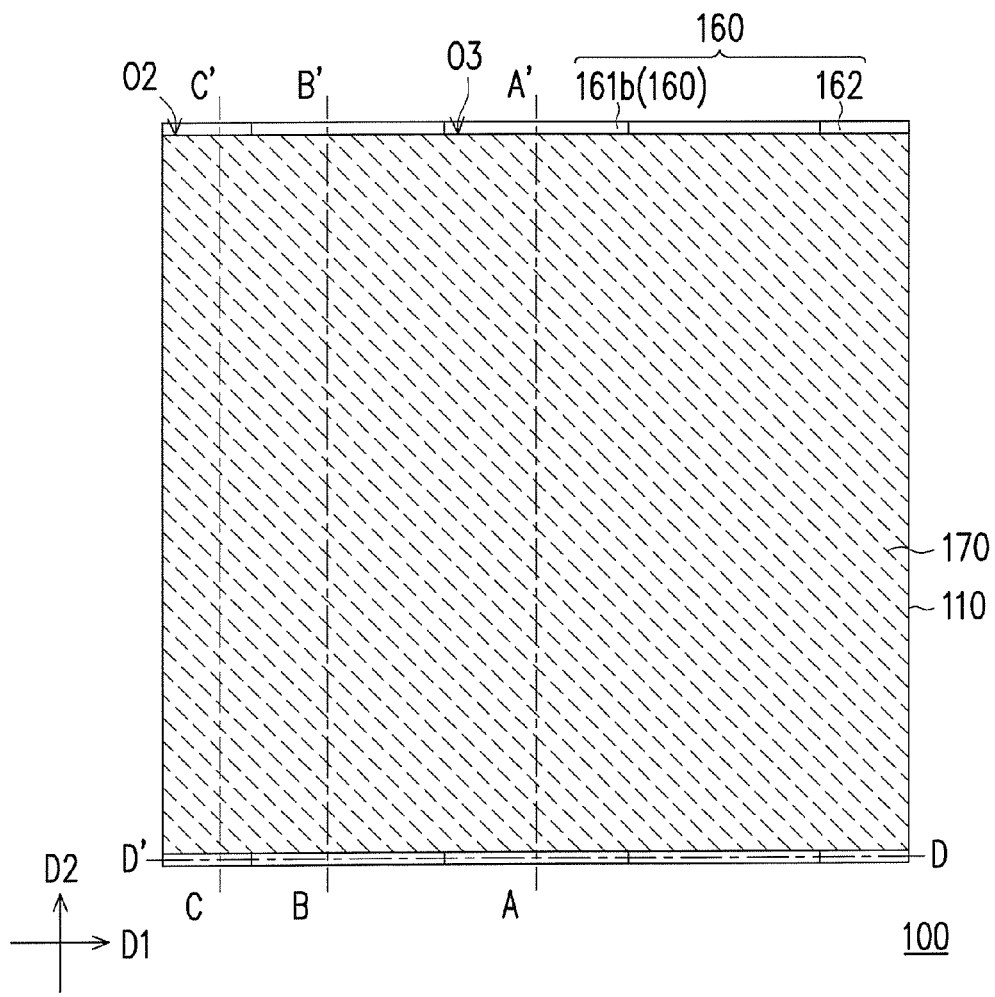
Figure 2H:
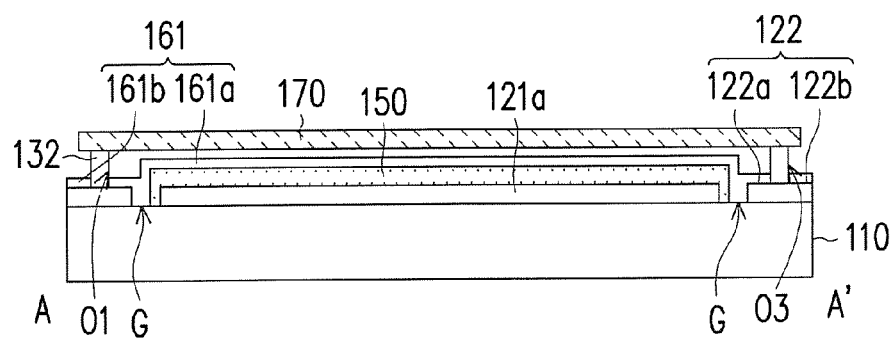

Referring to FIG. 1H and FIG. 2H, in order to enhance reliability of the organic electro-luminescence device, an encapsulation layer 170 may be formed to cover and encapsulate the second conductive layer 160 and the patterned organic functional layer 150. In this embodiment, the encapsulation layer 170 is adhered to the base film 132 to encapsulate the portion 161a of the second conductive layer 160 and the patterned organic functional layer 150. In some embodiments, the encapsulation layer 170 is formed by atomic layer deposition (ALD) or plasma enhanced chemical vapor deposition (PECVD) over the base film 132 and the second conductive layer 160 to encapsulate the second conductive layer 160 and the patterned organic functional layer 150.

It is noted that deviation of the substrate 110 along a direction D2 perpendicular to the transmission direction D1 often occurs when the substrate 110 is conveyed along the transmission direction D1. Such deviation of the substrate 110 may cause mis-alignment between stacked layers of the organic electro-luminescence devices. Since the first mask 130 is formed over the substrate 110 and the second mask 140 is provided during the formation of the patterned organic layer 150, the first mask 130 and the second mask 140 can minimize the above-mentioned mis-alignment issue in the directions D1 and D2.

Figure 2I:
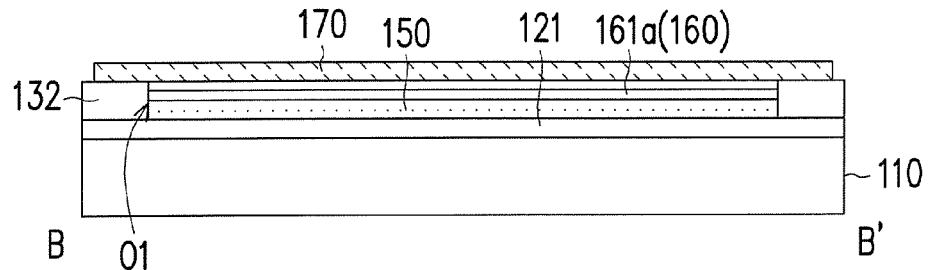
FIG. 2I is a cross-sectional view along the cross-section B-B' in FIG. 1H.
Figure 2J:
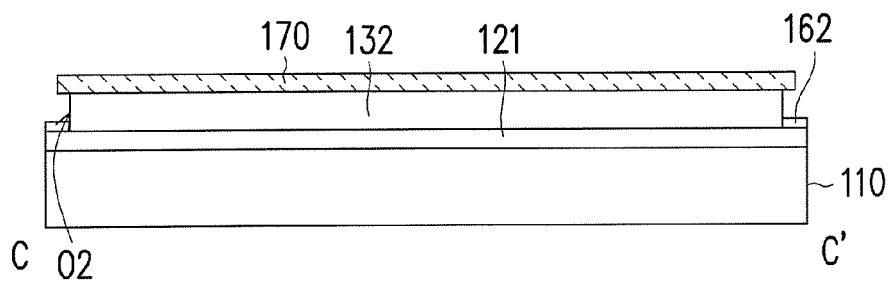
FIG. 2J is a cross-sectional view along the cross-section C-C' in FIG. 1H.
Figure 2K:
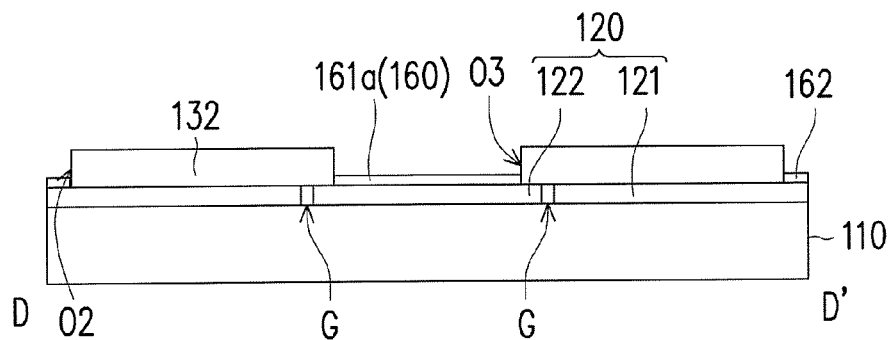
FIG. 2K is a cross-sectional view along the cross-section D-D' in FIG. 1H.

FIG. 2I is a cross-sectional view along the cross-section B-B' in FIG. 1H. FIG. 2J is a cross-sectional view along the cross-section C-C' in FIG. 1H. FIG. 2K is a cross-sectional view along the cross-section D-D' in FIG. 1H.

Referring to FIG. 1G~1H, FIG. 2G~2K, an organic electro-luminescence device 100 including a substrate 110, a first conductive layer 120, a base film 132, a patterned organic functional layer 150 and a second conductive layer 160 is provided. The first conductive layer 120 is formed on the substrate 110 and includes a first electrode 121 and at least one first contact pattern 122, wherein the first contact patterns 122 are electrically insulated from the first electrode 121. In this embodiment, the first conductive layer 120 may be patterned to include two notches located at two opposite peripheral sides thereof and the first contact patterns 122 are located in the notches. It is noted that the shape and the number of the first contact patterns 122 are not limited in the disclosure. In addition, a gap G exists between the first electrode 121 and each first contact pattern 122 such that the first contact patterns 122 are capable of being electrically insulated from the first electrode 121.

The base film 132 is disposed on the first conductive layer 120 and includes at least one opening (i.e. main opening O1) for exposing at least one portion of the first electrode 121 and a portion of the first contact pattern 122. In this embodiment, the base film 132 may be a frame film including a main opening O1 located in a central area of the base film 132, at least one first peripheral opening O2 located at a corner of the base film 132 and at least a second peripheral opening O3 located at a peripheral side of the base film 132 that is parallel to the trans mission direction D1. As shown in FIG. 1G, there are four first peripheral openings O2 respectively located at each corner of the base film 132 and two second peripheral openings O3 located at two opposite peripheral sides of the base film 132 parallel to the transmission direction D1.

Referring to FIG. 1G~1H, FIG. 2G~2K, the first electrode 121 may include a portion 121a of the first electrode 121 and at least one portion 121b of the first electrode 121. The portion 121a of the first electrode 121 located in central area and a portion 122a of each first contact pattern 122 are exposed by the main opening O1 of the base film 132. Meanwhile, the portions 121b of the first electrode 121 is exposed by the first peripheral openings O2 of the base film 132 and portions 122b of the first contact patterns 122 are exposed by the second peripheral openings O3 of the base film 132. Furthermore, the gaps G between the first electrode 121 and each first contact pattern 122 are partially exposed by the main opening O1 of the base film 132, as shown in FIG. 1G.

Referring to FIG. 1G~1H, FIG. 2G~2K, the patterned organic functional layer 150 is disposed on the portion 121a of the first electrode 121 exposed by the main opening O1 of the base film 132. The patterned organic functional layer 150 may cover sidewalls of the portion 121a of the first electrode 121 that are exposed by the main opening O1 of the base film 132 and be in contact with the substrate 110. In other words, the patterned organic functional layer 150 may extend into the gaps G so as to encapsulate sidewalls and a top surface of the first electrode 121 that are exposed by the first opening O1 of the base film 132. In this embodiment, the patterned organic functional layer 150 is not in contact with the first contact patterns 122. In some embodiments, the patterned organic functional layer 150 may be contact with the first contact patterns 122. The disclosure is not limited thereto.

Referring to FIG. 1G~1H, FIG. 2G~2K, the second conductive layer 160 may include a second electrode 161 and at least one second contact pattern 162. The second electrode 161 may include a portion 161a and at least one portion 161b spaced apart from the portion 161a by the base film 132. The portion 161a of the second electrode 161 is formed on the patterned organic functional layer 150 and the portions 122a of the first contact patterns 122 exposed by the main opening O1 of the base film 132. The portion 161a of the second electrode 161 is spaced apart from the first electrode 121 by the patterned organic functional layer 150. The portions 161b of the second electrode 161 are formed on the portions 122b of the first contact patterns 122 exposed by the second peripheral opening O3 of the base film 132. Since the patterned organic functional layer 150 encapsulates the portion 121a of the first electrode 121, short circuit may be prevent from between the first electrode 121 and the second electrode 161 by the patterned organic functional layer 150. The second contact patterns 162 are formed on the portions 121b of the first electrode 121 exposed by the first peripheral opening O2. Accordingly, the second electrode 161 is electrically connected to the first contact patterns 122 and the second contact patterns 162 are electrically connected to the first electrode 121.

Furthermore, the encapsulation layer 170 may be formed to encapsulate the second conductive layer 160 and the patterned organic functional layer 150 in order to enhance reliability of the organic electro-luminescence device, as shown in FIG. 1H and FIG. 2H~2K. In this embodiment, the encapsulation layer 170 is adhered to the base film to encapsulate the second conductive layer 160 and the patterned organic functional layer 150.

In this disclosure, the first mask 130 and the second mask 140 formed on the substrate can effectively resolve alignment issue of stacked layers in the organic electro-luminescence devices, and thus enhance yield rate of mass production of the organic electro-luminescence devices. Furthermore, during the process, instead of removing the first mask 130 entirely, only the release film 131 is removed. Accordingly, the remained base film 132 may prevent the second conductive layer 160 from contacting the first conductive layer 120. In addition, the base film 132 may enhance lateral reliability of the organic electro-luminescence device.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method for fabricating an organic electro-luminescence device, comprising:
    forming a first conductive layer on a substrate, the first conductive layer comprising a first electrode and a first contact pattern electrically insulated from the first electrode;
    forming a first mask on the first conductive layer, the first mask comprising a release film, a base film disposed between the release film and the first conductive layer and at least one opening for exposing at least one portion of the first electrode and a portion of the first contact pattern to an environment where the substrate and the first mark are placed;
    forming a patterned organic functional layer by shielding of a second mask, the patterned organic functional layer covering a portion the first mask and the at least one portion of the first electrode exposed by the first mask, and the second mask being disposed over the first mask to shield the at least one portion of the first electrode exposed by the first mask and the portion of the first contact pattern exposed by the first mask;
    removing the second mask after forming the patterned organic functional layer;
    forming a second conductive layer over the patterned organic functional layer, the first mask, the at least one portion of the first electrode exposed by the first mask and the portion of the first contact pattern exposed by the first mask; and
    patterning the second conductive layer by removing the release film and a portion of the second conductive layer on the release film to form a second electrode electrically connected to the first contact pattern and a second contact pattern electrically connected to the first electrode.

2. The method according to claim 1 further comprising:
    forming a encapsulation layer to encapsulate the second conductive layer and the patterned organic functional layer.

3. The method according to claim 2, wherein the encapsulation layer is adhered to the base film to encapsulate the second conductive layer and the organic functional layer.

4. The method according to claim 2, wherein the encapsulation layer is formed by atomic layer deposition or plasma enhanced chemical vapor deposition over the base film and the second conductive layer to encapsulate the second conductive layer and the patterned organic functional layer.

5. The method according to claim 1, wherein the first conductive layer comprises a notch and the first contact pattern is located in the notch.

6. The method according to claim 5, wherein a gap is between the first electrode and the first contact pattern.

7. The method according to claim 6, wherein the gap is partially exposed by the at least one opening of the first mask and is partially shielded by the second mask.

8. The method according to claim 1, wherein the first mask comprises a main opening for exposing the first electrode and the first contact pattern partially, a first peripheral opening for exposing the first electrode partially and a second peripheral opening for exposing the first contact pattern partially.

9. The method according to claim 1, wherein the first electrode and the second electrode are spaced apart by the organic functional layer.

10. The method according to claim 1, wherein the substrate is conveyed along a transmission direction to form the first conductive layer, the first mask, the patterned organic functional layer, and the second conductive layer on the substrate.

11. The method according to claim 10, wherein the first mask or the second mask is a frame mask.

12. The method according to claim 10, wherein the second mask comprises at least one pair of shielding strips, and a lengthwise direction of the shielding strips is parallel to the transmission direction.

13. An organic electro-luminescence device, comprising:
    a substrate;
    a first conductive layer formed on the substrate comprising a first electrode and a first contact pattern, wherein the first contact pattern is electrically insulated from the first electrode;
    a base film disposed on the first conductive layer comprising at least one opening for exposing at least one portion of the first electrode and a portion of the first contact pattern to an environment where the substrate and the first mark are placed;
    a patterned organic functional layer disposed on the portion of the first electrode exposed by the base film; and
    a second conductive layer comprising a second electrode and a second contact pattern, the second electrode being disposed on the organic functional layer and the portion of the first contact pattern exposed by the base film, the second contact pattern being disposed on the at least one portion of the first electrode exposed by the base film, wherein the second electrode is electrically connected to the first contact pattern and the second contact pattern is electrically connected to the first electrode.

14. The organic electro-luminescence device according to claim 13 further comprising:
   a encapsulation layer disposed on the base film encapsulating the second conductive layer and the patterned organic functional layer.

15. The organic electro-luminescence device according to claim 13, wherein the base film is a frame film.

16. The organic electro-luminescence device according to claim 13, wherein the first conductive layer comprises a notch and the first contact pattern is located in the notch.

17. The organic electro-luminescence device according to claim 16, wherein a gap is between the first electrode and the first contact pattern.

18. The organic electro-luminescence device according to claim 17, wherein the gap is exposed by the at least one opening of the base film.

19. The organic electro-luminescence device according to claim 13, wherein the base film comprises a main opening for exposing the first electrode and the first contact pattern partially, a first peripheral opening for exposing the first electrode partially and a second peripheral opening for exposing the first contact pattern partially.

20. The organic electro-luminescence device according to claim 13, wherein the first electrode and the second electrode are spaced apart by the patterned organic functional layer.

* * * * *